United States Patent [19]

Singh et al.

[11] Patent Number: 5,401,712
[45] Date of Patent: Mar. 28, 1995

[54] METHOD OF MANUFACTURE OF SINGLE PHASE CERAMIC SUPERCONDUCTORS

[75] Inventors: Jitrenda P. Singh, Naperville; Roger B. Poeppel, Glen Ellyn; Kenneth C. Goretta; Nan Chen, both of Downers Grove, all of Ill.

[73] Assignee: University of Chicago, Chicago, Ill.

[21] Appl. No.: 947,324

[22] Filed: Sep. 18, 1992

[51] Int. Cl.⁶ .................... H01B 12/00; H01L 39/12
[52] U.S. Cl. .................... 505/500; 505/742; 505/782; 505/501; 252/518; 252/521
[58] Field of Search ............... 505/742, 1, 782; 252/518, 521

[56] References Cited

U.S. PATENT DOCUMENTS

| | | | |
|---|---|---|---|
| 5,024,992 | 6/1991 | Morris | 505/780 |
| 5,106,829 | 4/1992 | Quadri | 505/780 |
| 5,149,684 | 9/1992 | Woolf | 505/742 |
| 5,232,907 | 8/1993 | Matsuhiro | 505/780 |
| 5,244,868 | 9/1993 | Jin | 505/780 |
| 5,250,509 | 10/1993 | Hettich | 505/782 |

*Primary Examiner*—Paul Lieberman
*Assistant Examiner*—M. Kopec
*Attorney, Agent, or Firm*—Reinhart, Boerner, Van Deuren, Norris & Rieselbach

[57] ABSTRACT

A ceramic superconductor is produced by close control of oxygen partial pressure during sintering of the material. The resulting microstructure of $YBa_2Cu_3O_x$ indicates that sintering kinetics are enhanced at reduced $p(O_2)$ and that because of second phase precipitates, grain growth is prevented. The density of specimens sintered at 910° C. increased from 79 to 94% theoretical when $p(O_2)$ was decreased from 0.1 to 0.0001 MPa. The increase in density with decrease in $p(O_2)$ derives from enhanced sintering kinetics, due to increased defect concentration and decreased activation energy of the rate-controlling species undergoing diffusion. Sintering at 910° C resulted in a fine-grain microstructure, with an average grain size of about 4 $\mu$m. Post sintering annealing in a region of stability for the desired phase converts the second phases and limits grain growth. The method of pinning grain boundaries by small scale decompositive products and then annealing to convert its product to the desired phase can be used for other complex asides. Such a microstructure results in reduced microcracking, strengths as high as 230 MPa and high critical current density capacity.

17 Claims, 17 Drawing Sheets

METHOD OF MANUFACTURE OF SINGLE PHASE CERAMIC SUPERCONDUCTORS

The U.S. Government has certain rights in this invention pursuant to Contract No. W-31-109-Eng-38 of the Department of Energy.

The present invention is concerned generally with a method of manufacture and a product ceramic superconductor. More particularly, the invention is concerned with a method of controlling oxygen gas pressure and temperature in a treatment protocol to control the microstructural makeup of ceramic superconductors, such as $YBa_2Cu_3O_x$ to obtain single phase materials with good mechanical properties as well as a high critical current capacity.

Ceramic superconductors constitute an important group of materials having substantial potential applications arising from their very high superconducting critical temperature. $YBa_2Cu_3O_x$ (YBCO) is one of the most widely studied and potentially useful high-temperature superconductors. For these ceramic materials to be useful in commercial applications, they must however possess good superconducting and mechanical properties. However, the mechanical strength of such ceramics as YBCO processed by conventional methods is generally unacceptably low. The low strength values have been attributed to the fact that the density of bulk YBCO specimens sintered in a 100% oxygen atmosphere is generally low (80–90% theoretical). Sintering at temperatures above about 950° C. results in higher densities, but gives rise to degradation in critical current density ($J_c$), partly due to the presence of second phases. Furthermore, sintering at higher temperatures also results in grain growth and accompanying microcracking. Such microcracking results in reduced strength and will also act as weak links and substantially degrade the $J_c$.

Improvement in density, as well as mechanical and superconducting properties, has been achieved recently but only by making composites of YBCO with silver additions. Another approach to improving density and mechanical properties has been the fabrication of monolithic YBCO through the control of processing parameters, such as powder particle size and heat treatment. Sintering at lower $p(O_2)$ has the potential for producing specimens with relatively small grains. However, it has been observed that YBCO becomes unstable at very low $pO_2$ and may precipitate undesirable phases, with a consequent degradation in $J_c$.

It is therefore one object of the invention to provide an improved method of manufacturing high temperature ceramic superconductors.

It is another object of the invention to provide a novel method of making high temperature ceramic superconductors using well controlled sintering techniques.

It is still another object of the invention to provide an improved method of manufacture and ceramic superconductor substantially free of impurity and second phases of the $YBa_2Cu_3O_x$ system.

It is yet another object of the invention to provide a novel method of manufacture and ceramic superconductor product prepared by solid phase formation and dissolution as needed to control grain growth, density and $J_c$ capacity.

It is a further object of the invention to provide an improved method of manufacture and product ceramic superconductor having high density, high strength and high $J_c$ capacity.

It is an additional object of the invention to provide a novel method of manufacture of superconducting ceramics by use of variable oxygen partial pressure during sintering of the superconductor.

It is yet another object of the invention to provide an improved method of manufacture and product ceramic superconductor having a balance of good mechanical strength with small grain size, high density and high $J_c$ capacity.

It is still another object of the invention to provide a novel ceramic superconductor and method of manufacture to produce a substantially single phase ceramic superconductor sintered to high density while sustaining high $J_c$ capacity.

Other objects and advantages of the invention will become apparent from the Detailed Description and the drawings described hereinbelow and also from a copending application of the assignee of this application filed on the same day and incorporated by reference herein.

DETAILED DESCRIPTION OF PREFERRED EMBODIMENTS

Figure 1A:
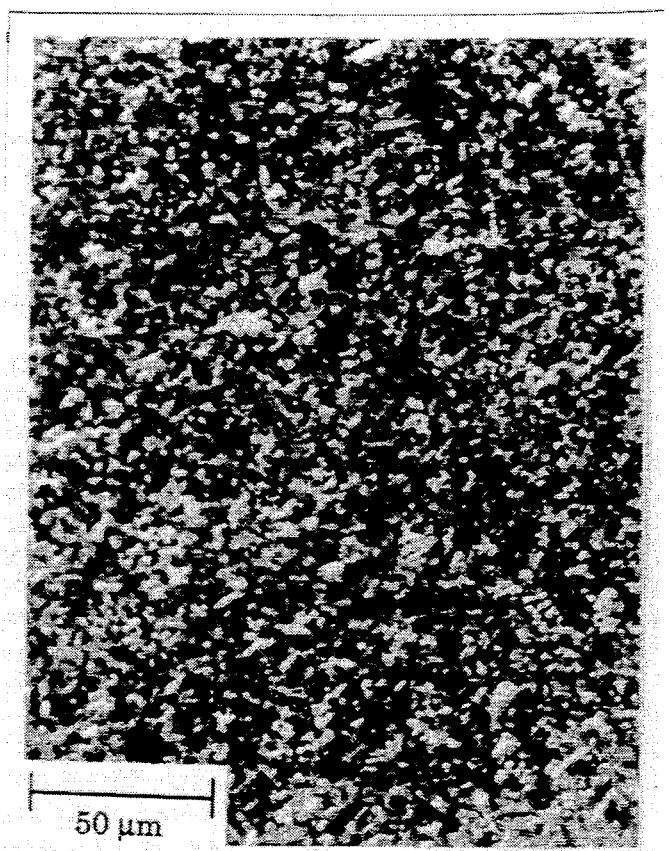
FIG. 1A illustrates an optical micrograph of $YBa_2Cu_3O_x$ specimens prepared by sintering in flowing oxygen at 910° C. for 10h.
Figure 1B:
FIG. 1B shows an optical micrograph of $YBa_2Cu_3O_x$ sintered at 925° C. for 10h.
Figure 1C:
FIG. 1C likewise shows $YBa_2Cu_3O_x$ sintered at 935° C. for 12h
Figure 1D:
FIG. 1D shows $YBa_2Cu_3O_x$ sintered at 950° C. for 20h.
Figure 2A:
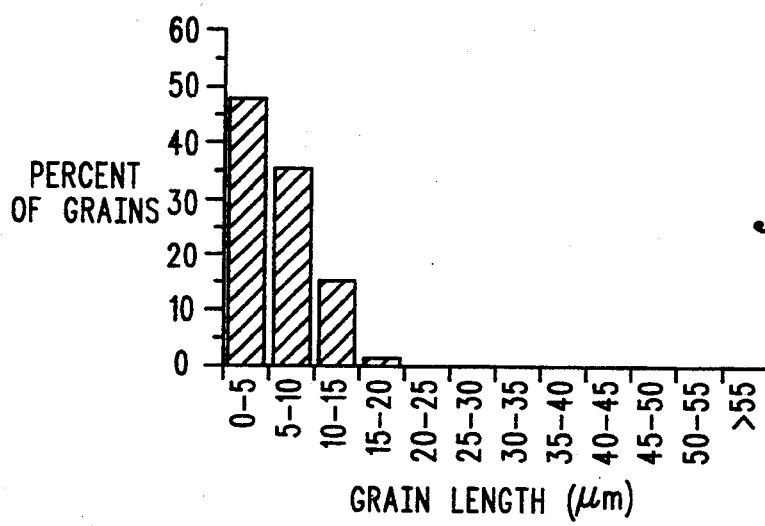
FIG. 2 shows grain length distributions in $YBa_2Cu_3O_x$ wires sintered in flowing oxygen at 925° for 10h (FIG. 2A); 935° C. for 12h (FIG. 2B); 935° C. for 20h (FIG. 2C) and 950° C. for 20h (FIG. 2D)
Figure 2B:
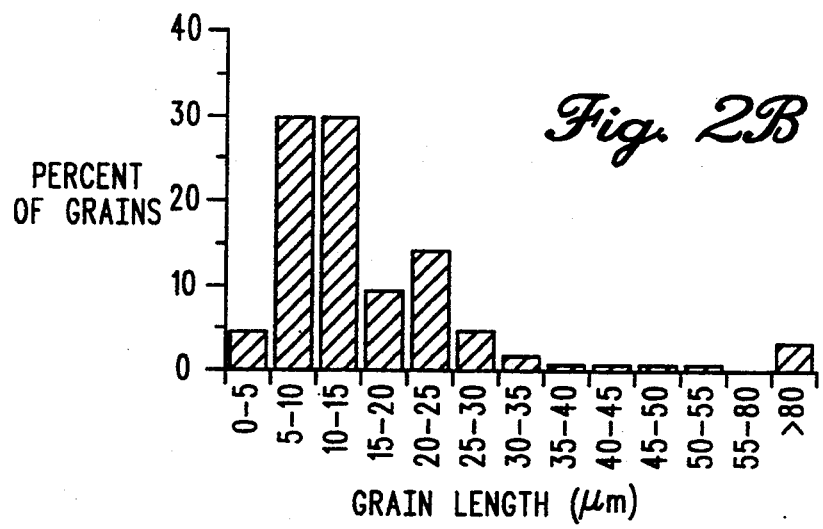
Figure 2C:
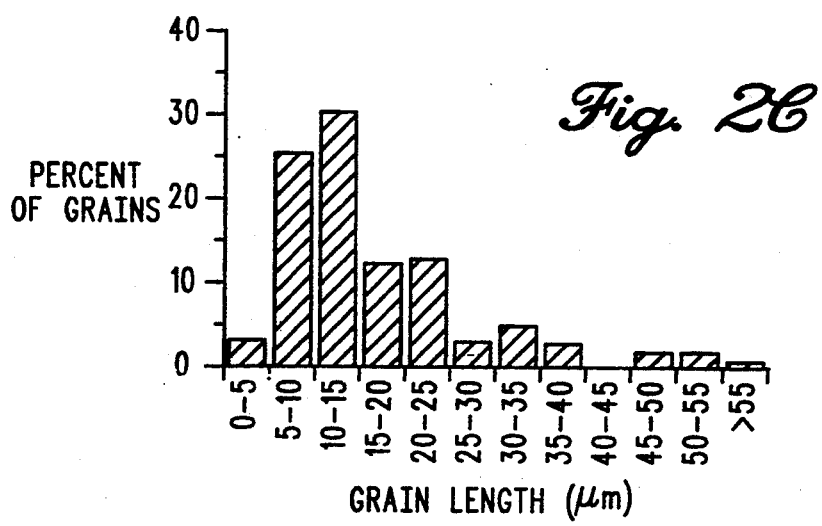
Figure 2D:
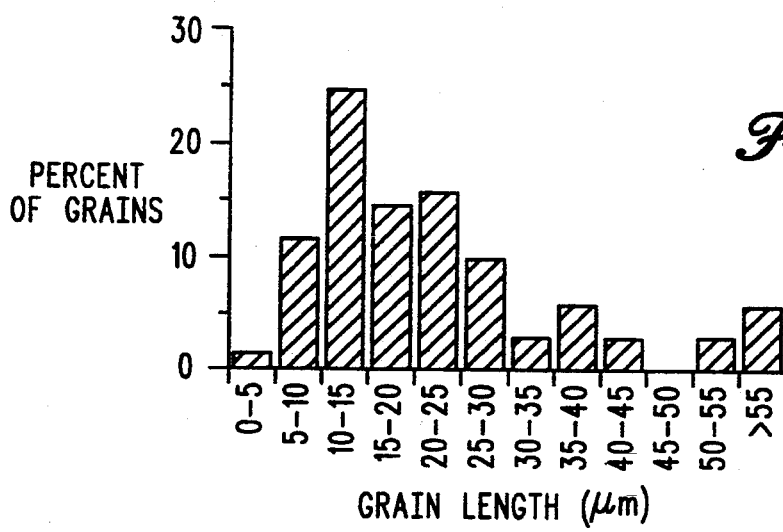
Figure 3A:
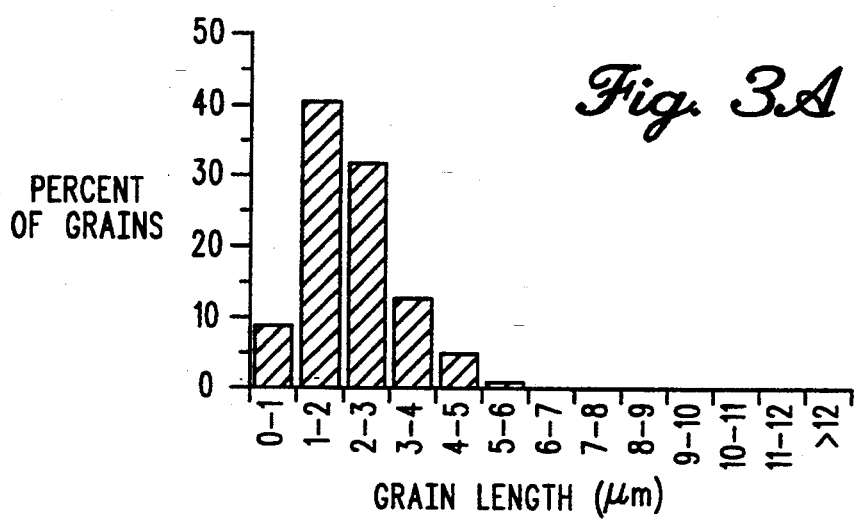
FIG. 3 illustrates grain width distribution in $YBa_2Cu_3O_x$ wires sintered in flowing oxygen at 925° C. for 10h (FIG. 3A); 935° C. for 12h (FIG. 3B), 935° C. for 20h (FIG. 3C) and 950° C. for 20h (FIG. 3D)
Figure 3B:
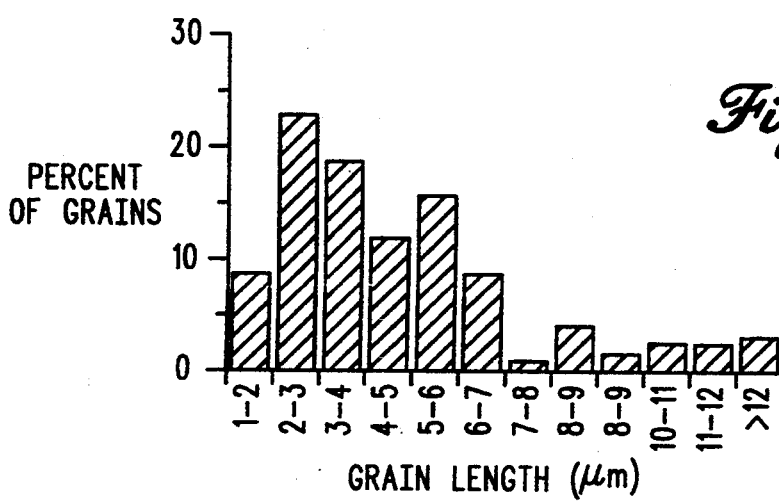
Figure 3C:
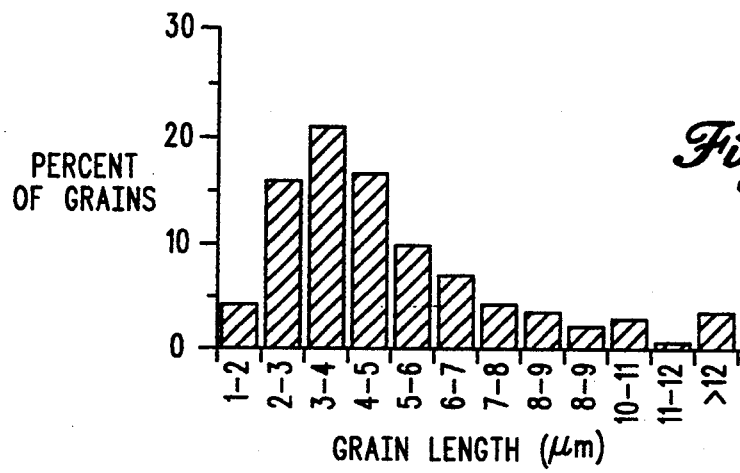
Figure 3D:
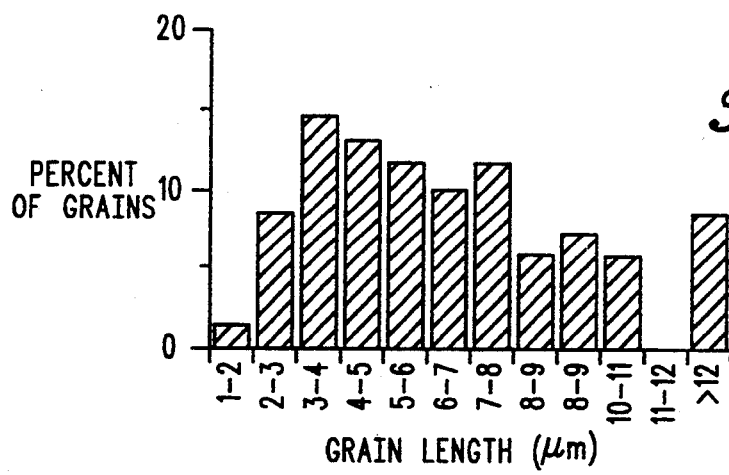

It is well understood and accepted that ceramic superconductors behave in substantially the same predictable manner as any multielement containing ceramic insofar as methods of formation of the ceramic compound, kinetics of diffusion in the ceramic, and phase formation and phase conversion pursuant to acceptable phase diagrams. Mindful of the applicability of these basic concepts to all ceramic superconductors, the invention will be described for the preferred system of $YBa_2Cu_3O_x$ prepared in a form having high critical current capacity as well as good mechanical properties.

$YBa_2Cu_3O_x$ powder can be synthesized, for example, by solid-state reaction of the constituent oxides $Y_2O_3$, CuO, and BaO. Powders of $Y_2O_3$, and $BaCO_3$ were mixed in appropriate proportions and were wet-ball-milled for approximately 12h. The resulting slurry was dried in air and then vacuum-calcined in flowing oxygen at a reduced total pressure of $\simeq 0.003$ MPa. The heating schedule included slowly heating in flowing oxygen at a reduced total pressure of $\simeq 0.0003$ MPa at 810° C. for 20h and holding at this temperature for 8h. Subsequently, the powder was cooled at 450° C. in a 100% flowing oxygen atmosphere in 10h. The powder was held at 450° C. for 3h and then slowly cooled to room temperature. This method results in the decomposition of $BaCO_3$ at lower temperatures (starting at 650° C and completed at 800° C.) and eliminates formation of undesired impurity phases as indicated by conventional differential thermal analysis (DTA). No melting events associated with impurity phases were observed. The calcined powder was ground in a tungsten carbide rotary mill. The milled powder had an average particle size of $\simeq 3$ μm. Phase composition was confirmed as the expected phase pure form of $YBa_2Cu_3O_x$ by X-ray diffraction analysis.

The $YBa_2Cu_3O_x$ powder was mixed with appropriate solvent, dispersant, binder, and plasticizer to form a slip mixture for extrusion. The slip mixture was milled for $\simeq 16$h in a plastic bottle containing $ZrO_2$ balls. Subsequently, the solvent in the slip was partially evaporated to obtain a plastic mass. The plastic mass was then forced through a die at high pressures to produce flexible wires of $YBa_2Cu_3O_x$. The wire was extruded in a continuous mode from which approximately 30 cm long pieces were cut and dried in air to achieve rigidity. These dried wires had a typical density of approximately 52% theoretical.

The extruded wires (after drying) were cut into approximately 3 cm long pieces and were sintered in a tube furnace at different temperatures (910°–950° C.) and various $p(O_2)$ levels (42 Pa–0.1 MPa). The wires were placed on a flat alumina tray which was subsequently introduced in the hot zone of the furnace. The $p(O_2)$ was controlled by using a mixture of oxygen and argon gases as the sintering environment in which the ratio of oxygen and argon was appropriately varied. Sintering was done in three stages: binder burnout, densification, and oxygen anneal. The initial binder burnout involved heating the specimens slowly to 240° C. and holding for 15h to completely remove the organics, after which the temperature was raised to 910°–950° C. at a rate of 1°C./min. In the densification step, specimens were sintered at various temperatures for various lengths of time (10–20h) and subsequently cooled to 450°C. at $\simeq 1$°C./min. Finally, the wires were annealed at 450° C. for 12h in flowing oxygen at 0.1 MPa. The wires were then allowed to cool slowly in the furnace to room temperature, at which time the oxygen was turned off and the specimens removed. The sintered wires were reasonably straight, and the phase purity of the sintered wires was confirmed by X-ray diffraction analysis to be $YBa_2Cu_3O_x$.

Bulk density of the relatively dense ($\geqq 90\%$ theoretical) sintered wires was measured by the Archimedes method while the apparent density of relatively porous ($\leqq 85\%$ theoretical) specimens was measured by the geometrical method. Typically, four to six specimens were used for each set of preparation conditions. The microstructure was evaluated by both optical and electron microscopy. Grain microstructures were evaluated in polished longitudinal sections by polarized light in order to reveal grain sizes. The fracture surface of specimens was characterized by scanning electron microscopy. The specimens were composed of $\simeq 3$ cm long ($\simeq 1.14$ mm or 45mil diameter) wires, and the strength was measured in an Instron mechanical testing machine in a three-point bending mode with a loading span of 1.825 cm and a crosshead speed of 0.127 cm/min. At least six specimens were tested for each set of conditions. The resistivity was measured by a conventional four-probe technique. Critical current density values were determined with a criterion of 1.0 μmV/cm at 77K and zero applied magnetic field. Typically four specimens were again tested for each condition. These results will be described hereinafter and presented in tabular form.

1. $YBa_2Cu_3O_x$ sintered at $p(O_2)=0.1$ MPa.

The $YBa_2Cu_3O_x$ wires were sintered in flowing oxygen at a $p(O_2)$ of 0.1 MPa, and the wires had a range in density from $\simeq 79$ to 98% theoretical, as shown in Table I. The specimens (with density $\geqq 90\%$) had primarily closed porosity, as indicated by the microstructure. These wires consisted of substantially pure $YBa_2Cu_3O_x$ phase, as indicated by X-ray diffraction. As expected, the density increased with increasing sintering temperature. Typical micrographs of the polished sections of specimens sintered in the temperature range of 910°–950° C. are shown in FIG. 1. The grains are clearly twinned as a result of internal strains from tetragonal-to-orthorhombic transformations.

The grains in FIG. 1 are generally elongated and have varying aspect ratios. Measured distributions of grain length and width are shown in FIGS. 2 and 3. Based on the grain-length distribution shown in FIG. 2, average grain length also increased with increasing sintering time and temperature. It can be seen in Table I that the largest grain length increases from 5μm for specimens sintered at 910° C. for 10h to 182 μm for specimens sintered at 935° C. for 20h. A slight decrease in the largest grain size for the specimens sintered at 950° C. for 20h is probably due to sample variations as well the difficulty in locating the absolutely largest grain size in a sample. Although grain length increased with increasing sintering temperature, the increase in grain length was minimal for specimens sintered at temperature above 935° C., due probably to large grains impinging on one another. On the other hand, grain width increased monotonically in the transverse direction. As indicated in Table I, grain width increased from 5 μm for specimens sintered at 910° C. for 10h to 68 μm for specimens sintered at 950° C. for 20h. The specimens sintered at 910° C. had a very low density of 79% theoretical, and this resulted in reduced strength and $J_c$.

TABLE I

| Sintering temperature and time (°C.)/(h) | Density (% theoretical) | Average grain length (μm) | Average grain width (μm) | Maximum grain length (μm) | Maximum grain width (μm) |
| --- | --- | --- | --- | --- | --- |
| 910/10 | 79 ± 2.0 | ≈4.0 | ≈4.0 | 5 | 5 |
| 925/10 | 90 ± 2.5 | 6.0 | 2.0 | 20 | 6 |
| 935/12 | 96 ± 0.6 | 16.0 | 4.5 | 171 | 18 |
| 935/20 | 96 ± 1.7 | 16.5 | 4.5 | 182 | 26 |
| 950/20 | 98 ± 1.3 | 23.0 | 7.0 | 150 | 68 |

2. $YBa_2Cu_3O_x$ specimens sintered at $p(O_2) \leq 0.1$ MPa.

To obtain small grain microstructures, the specimens were sintered at relatively low temperatures. However, as discussed above, it was observed that sintering at lower temperatures (approximately 910° C.) and a $p(O_2)$ of 0.1 MPa resulted in the relatively low density of ≈79% theoretical. Such a low density is undesirable for both superconductivity by causing low Jc and inadequate mechanical properties. Therefore, experiments were conducted to evaluate the effects of $p(O_2)$ on the sintering behavior of $YBa_2Cu_3O_x$ in order to establish a high density while maintaining a small-grain microstructure. The $YBa_2Cu_3O_x$ wire specimens were sintered at 910° C. for 10h at different $p(O_2)$. The $p(O_2)$ was varied between about 0.1–0.000042 MPa. Table II shows the variation of measured density as a function of $p(O_2)$ for the specimens sintered at 910° C. for 10h. Generally, density increased with decreasing $p(O_2)$. It is believed that the increase in density with decrease in $p(O_2)$ is likely the result of enhanced sintering kinetics, due to increase in defect concentration and decrease in activation energy of the rate controlling species undergoing diffusion.

TABLE II

Dependence of density on $p(O_2)$ for $YBa_2Cu_3O_x$ specimens sintered at 910° C. for 10 h

| $p(O_2)$ (MPa) | Density (% theoretical) |
| --- | --- |
| 0.100000 | 79 ± 2.0 |
| 0.050000 | 85 ± 2.0 |
| 0.001000 | 91 ± 0.7 |
| 0.000100 | 94 ± 0.8 |
| 0.000042 | 83 ± 0.4 |

The microstructures for the specimens sintered at various $p(O_2)$ values are shown in FIG. 4. These specimens have small grain microstructures, with the largest grains being ≈5 μm, which is equal to the particle size in the original powder. Although grain microstructures are similar for the specimens sintered at various $p(O_2)$, the specimens sintered at a very low $p(O_2)$ such as $(42 \times 10^{-6}$ MPa) had a relatively low density (83%) and show the presence of second-phase impurities (see FIG. 4). These phases are primarily $Y_2BaCuO_5$, $Cu_2$, $BaCuO_2$ and $BaCO_3$, as detected by X-ray analysis (see FIG. 5). The low density and the presence of these second phases is the result of decomposition of $YBa_2Cu_3O_x$ at a low $p(O_2)$. At a given temperature, $YBa_2Cu_3O_x$ becomes thermodynamically unstable below a critical $p(O_2)$. The instant data indicate the critical value of $p(O_2)$ is $\approx 10^{-4}$ to $10^3$ MPa at 910° C. The data of Table II thus shows that in range of $10^{-4}$ to $10^{-3}$ MPa, the desired density of at least 90% is achieved.

It is this decomposition to second phases in the solid state that can (if properly utilized) give rise to important advantages, such as stabilizing grain size during the various thermal treatments of the $YBa_2Cu_3O_x$. Furthermore, once the densification has been accomplished, these second phases can then be subsequently thermally treated to obtain a substantially pure $YBa_2Cu_3O_x$ material having the desired superconductor phase with good $J_c$. If properly executed, this methodology will thus allow solving the long standing problem of obtaining a ceramic superconductor having excellent mechanical properties without sacrificing the high $J_c$ capacity needed for commercially useful ceramic superconductors.

Figure 5:
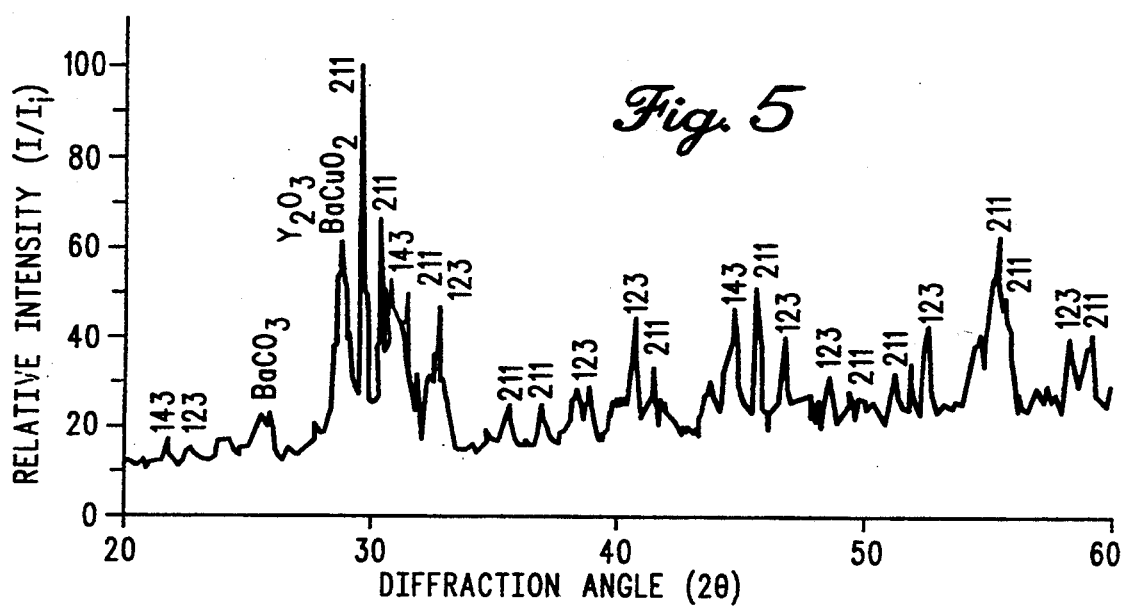
FIG. 5 illustrates X-ray diffraction peaks for $YBa_2Cu_3O_x$ specimens sintered at about 910° C. at $p(O_2)=42$ Pa.
Figure 4A:
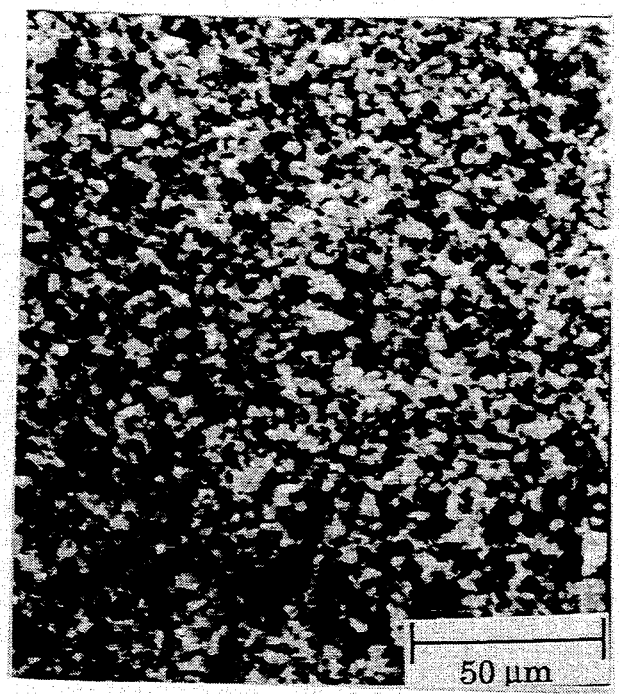
FIG. 4 shows optical micrographs of a $YBa_2Cu_3O_x$ sintered at 910° C. for 10h at p ($O_2$) of 0.05 MPa (FIG. 4A); 0.001 MPa (FIG. 4B); 0.0001 MPa (FIG. 4C) and 42 pa (FIG. 4D)
Figure 4B:
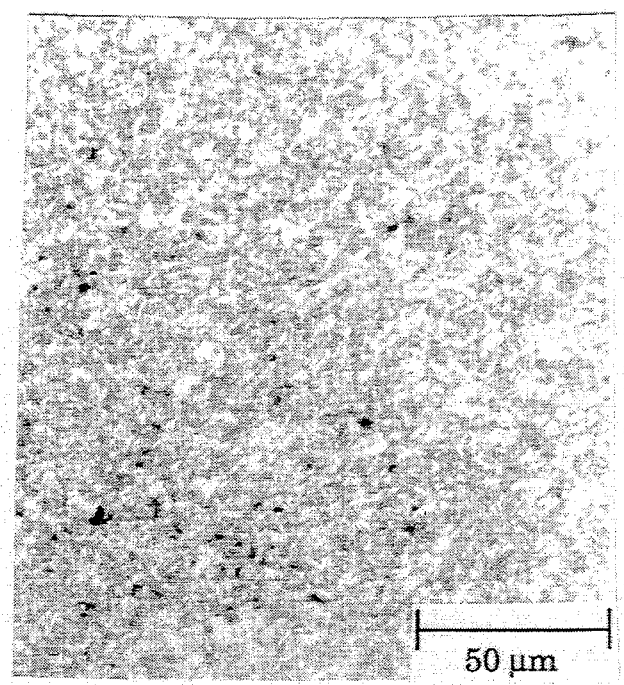
Figure 4C:
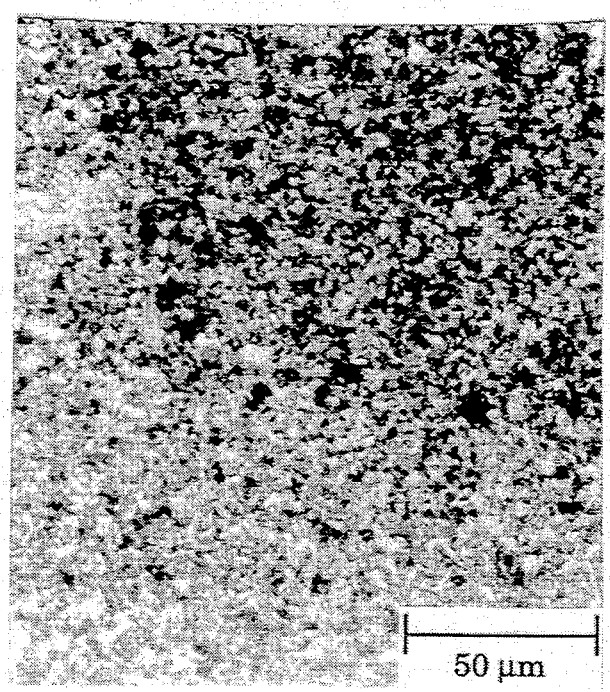
Figure 4D:
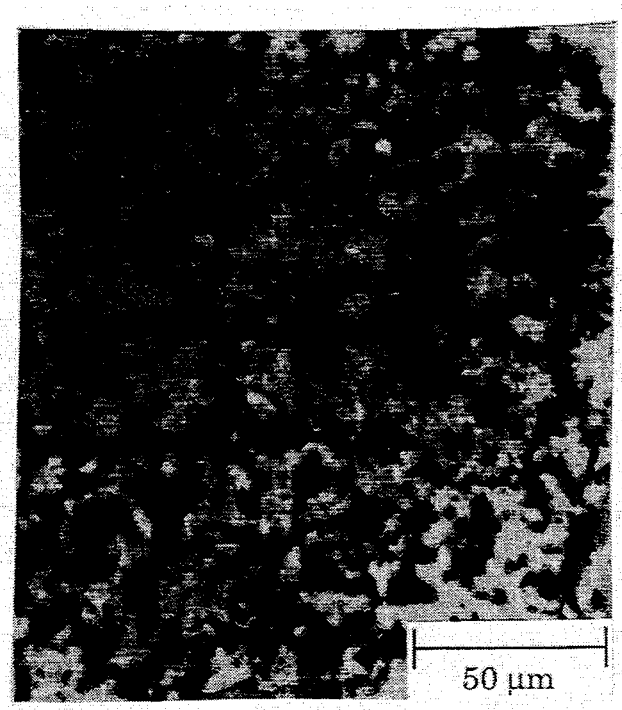

Phase purity of these $YBa_2Cu_3O_x$ specimens was verified by X-ray diffraction analysis made over the same angular range shown in FIG. 5 (illustrating the $YBa_2Cu_3O_x$ specimens sintered at 910° C. at $p(O_2)$ of 42 Pa showing the presence of second phases). The resulting X-ray diffraction pattern therefore showed only the expected diffraction peaks for phase pure $YBa_2Cu_3O_x$. This pattern thus appeared the same as FIG. 5 except the second phase peaks were all removed.

Post sintering appeals are then performed at various intermediate temperatures of about 800°–875° C. for 12–24 hours in an oxygen containing atmosphere. The phase pure $YBa_2Cu_3O_x$ was formed and no grain growth occurred. The resulting material exhibited a density of at least about 91% and a critical current density capacity of more than about 300A/cm².

Figure 9A:
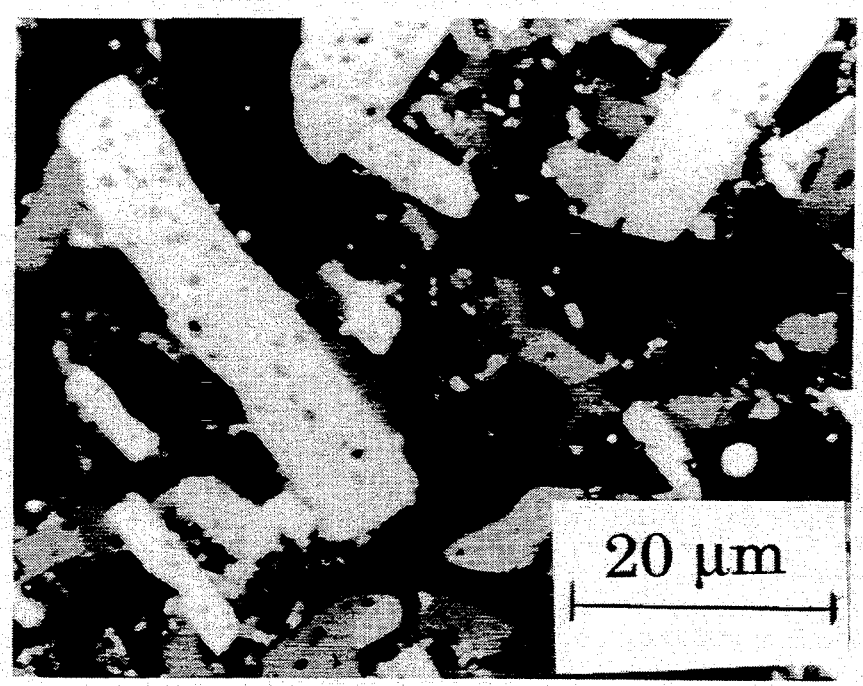
FIG. 9 illustrates representative microstructures of $YBa_2Cu_3O_x$ with FIG. 9A showing impurity phases sintered at 990° C. in $O_2$.
FIG. 9B showing phase pure $YBa_2Cu_3O_x$ sintered at 990° in $O_2$.
FIG. 9C showing phase pure $YBa_2Cu_3O_x$ sintered at 910° C. in 1% $O_2$.
Figure 9B:
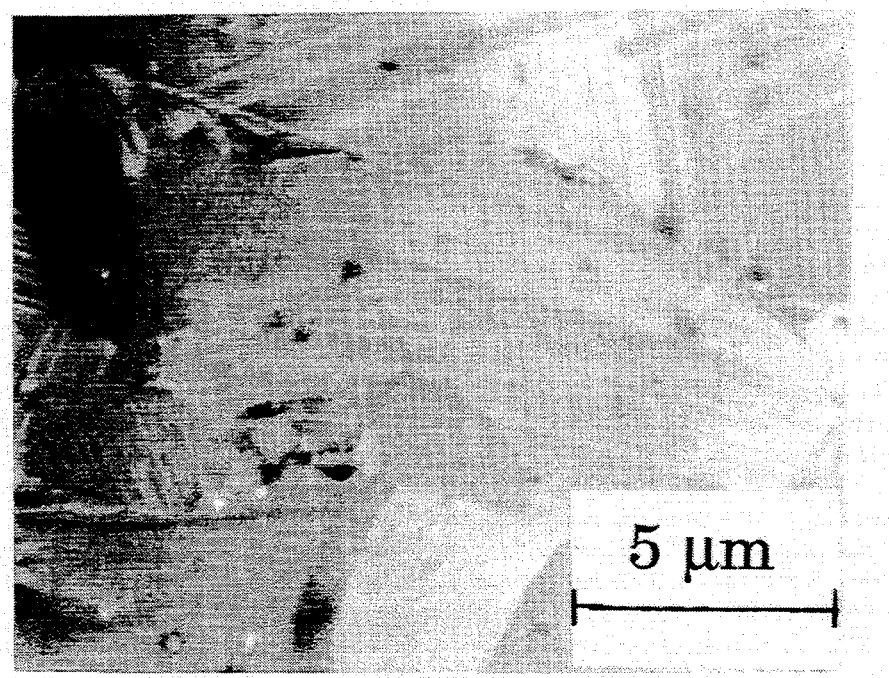
Figure 9C:
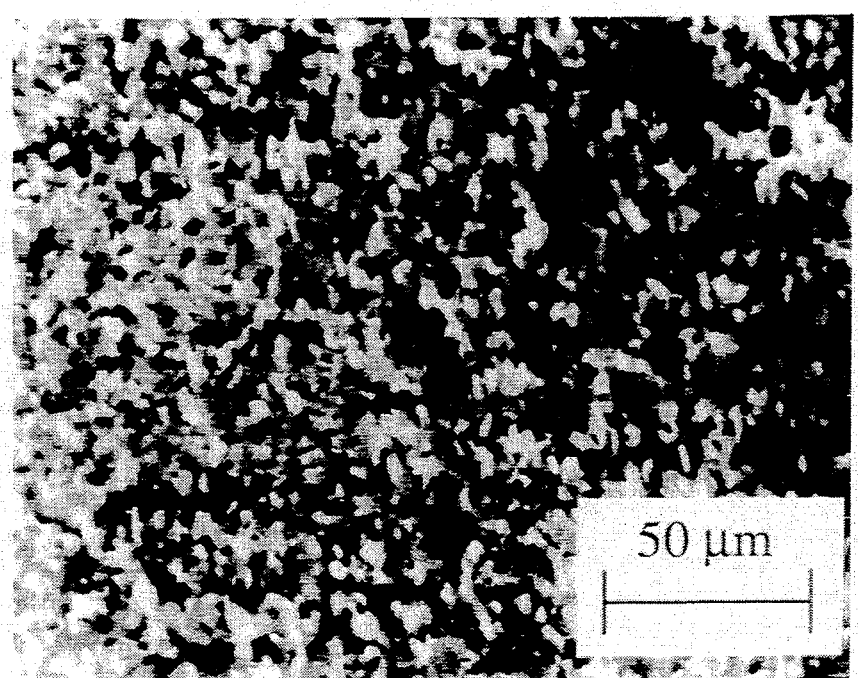
Figure 10:
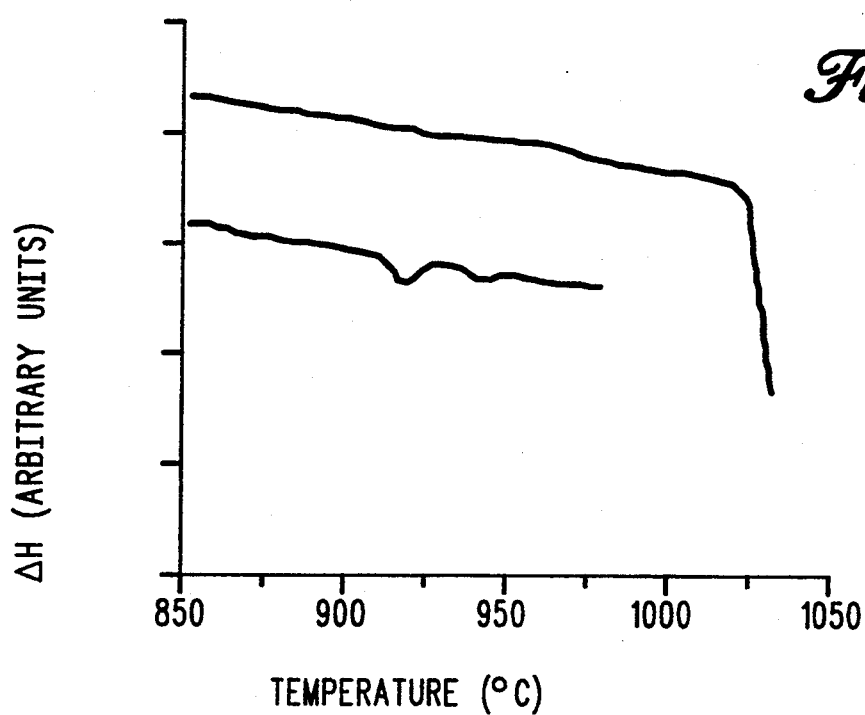
FIG. 10 illustrates differential thermal analysis plots of phase pure $YBa_2Cu_3O_x$ (top curve) and $YBa_2Cu_3O_x$ containing additional phases (bottom curve), both being heated in $O_2$ at 5° C./m.
Figure 11:
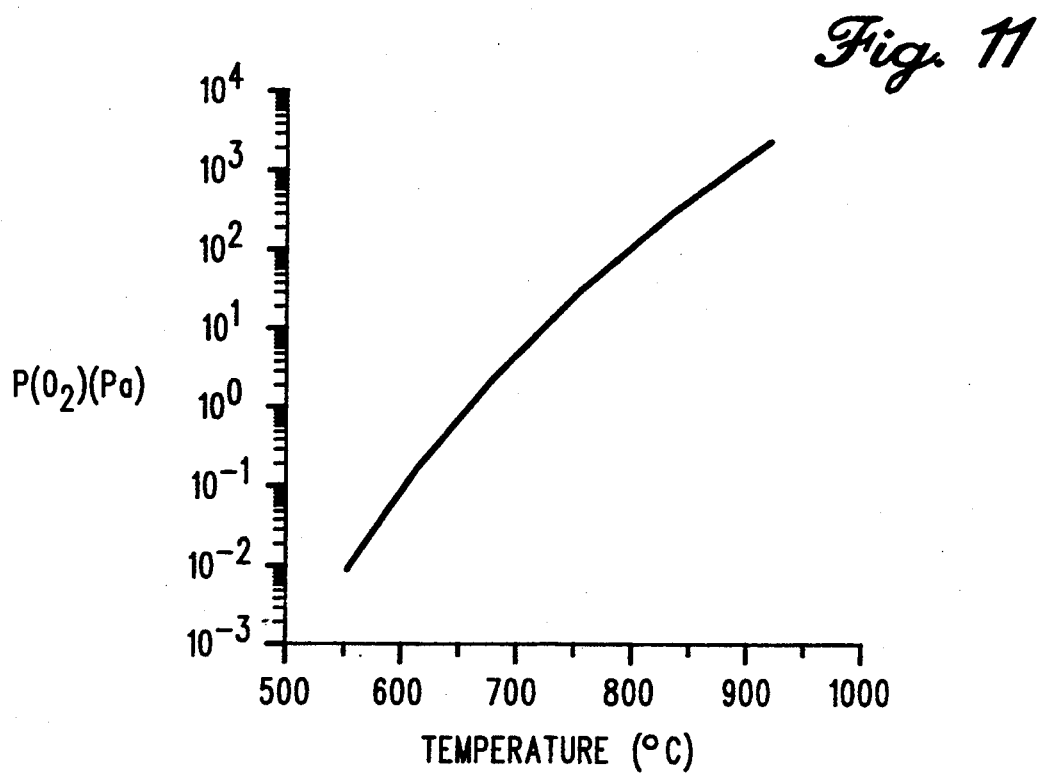
FIG. 11 shows the $p(O_2)$ stability line for $YBa_2Cu_3O_x$.

The microstructural appearances of a phase pure specimen of $YBa_2Cu_3O_x$ and a muiltiphase specimen are shown in FIG. 9. FIG. 9A illustrates a large grained $YBa_2Cu_3O_x$, including second phases wherein substantial, unwanted grain growth has occurred. As can be noted in FIG. 10 some liquid second phase has likely formed and can enhance grain growth. The effects of changing the $p(O_2)$ are shown in FIGS. 9B and C. In FIG. 9B is shown a phase pure $YBa_2Cu_3O_x$ annealed at 990° C. in $O_2$ wherein some grain growth has occurred but not nearly as much as in FIG. 9A. In FIG. 9C a substantially uniform, fine grained microstructure is shown after phase pure $YBa_2Cu_3O_x$ was sintered at 910° C. in a 1% $O_2$ atmosphere. No liquid second phase was formed during this sintering procedure. Sintering kinetics thus increase as $p(O_2)$ decreases, even if no liquid phase is present. If $p(O_2)$ is lowered sufficiently, the $YBa_2Cu_3O_x$ decomposes to produce solid state second phases. As shown in FIG. 11 for the $YBa_2Cu_3O_x$ the $p(O_2)$ level can be used to selectively create or transform second phases as needed in the processing and manufacture of ceramic superconductors. The solid second phases are primarily $Cu_2O$ and $Y_2BaCuO_5$ which are finely dispersed phases and can act to pin grain growth during the preferred manufacturing process. Therefore, the $YBa_2Cu_3O_x$ can be sintered to very high density (90–100%) without causing appreciable grain growth. Fine grained product can be produced with good strength (about 200–230 MPa fracture strength) with at least 90% of theoretical density. By performing post sintering anneals described hereinbefore, the solid second phases can be converted to $YBa_2Cu_3O_x$ (superconducting phase) without appreciable grain growth (the grain size in FIG. 9C is substantially unchanged after undergoing a post sintering anneal to remove second phases).

It is therefore important firstly to avoid heating at temperatures which can cause excessive grain growth. Further, the presence of the second phases can lead to forming liquid second phases at lower temperatures than the melting point of the $YBa_2Cu_3O_x$ phase (see FIG. 10). Such melting of second phases can result in excessive grain growth (see FIG. 9A). Consequently, in order to achieve a good balance of fine grain size and acceptable density (good mechanical properties) without detrimental effect on critical current density capacity, it is important to dictate in the manufacturing process the presence (or absence) of second phases in the method of the invention, as well as the thermal treatments and P(O$_2$)

The flexural strengths of specimens sintered at different temperatures and p(O$_2$) are shown in Table III. A dependence of strength on grain size is plotted in FIG. 6. For the purpose of illustrating the effects of grain size, strength data for only the specimens with density $\geq$90% have been considered in FIG. 6. Specimens with low density $\cong$85% have open porosity, and the large effect of open porosity on strength degradation can mask the effect of grain size. For the specimens with density over 90% sintered at p(O$_2$) $\geq$0.001 MPa (shown by rectangles), the strength increases with decreasing grain size and reaches a maximum value of 191 MPa at an average grain size of $\cong$4 μm. As indicated by X-ray diffraction patterns, these specimens were phase-pure and did not show any noticeable impurity or second phases. On the other hand, specimens sintered at 910° C./10h and p(O$_2$)=0.0001 MPa (shown by a triangle) had a relatively low strength in spite of having small grain size. As discussed in the previous section, at lower p(O$_2$), YBa$_2$Cu$_3$O$_x$ becomes unstable and second phases begin to appear, as shown in FIGS. 4 and 5. We believe that p(O$_2$)=0.0001 MPa represents, a region in which thermodynamic instability begins. Although at p(O$_2$)=0.0001 MPa the specimens do not show signs of bulk decomposition, local decomposition could occur. The local decomposition could have resulted in large critical flaws and observed low strength, in spite of small grain size.

$$\sigma_a + \sigma_i = \sigma_f = (2\gamma E/\pi c)^{\frac{1}{2}}$$

Because crack size, c, is proportional to grain size, d, $\sigma_a + \sigma_i = \sigma_f = (2\gamma E/\pi c)^{\frac{1}{2}}$ which is proportional to $(2\gamma E/\pi c)^{\frac{1}{2}}$ or
$\sigma_a$ is proportional to $(1/\sqrt{d}) - \sigma_i$ It is to be noted that although failure is generally expected to be controlled by the largest grain size, the proportionality of critical flaw size with average grain size is a reasonable assumption.

Figure 6:
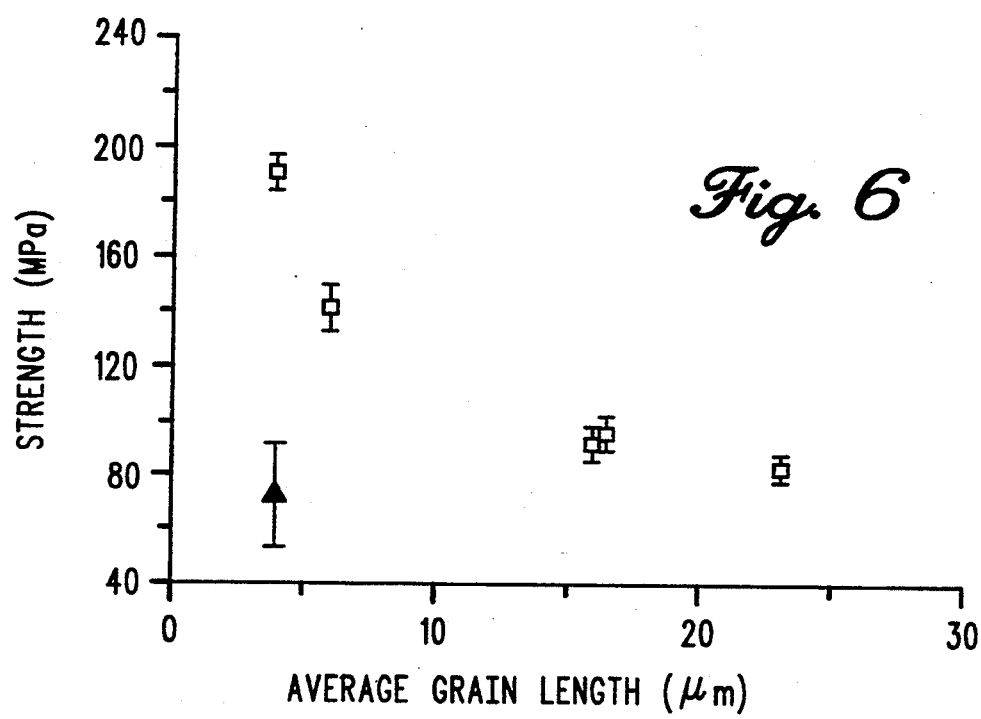
FIG. 6 shows the dependence of strength on grain size wherein rectangles represent specimens with over 90% density sintered at $p(O_2)$ greater than or equal to 0,001 MPa; triangles represent specimens with density over 90% interest at $p(O_2)$ equal to 0.0001 MPa.

The above equation concludes that applied failure stress is inversely proportional to the grain size, in accordance with the observed data shown in FIG. 6.

Figure 8:
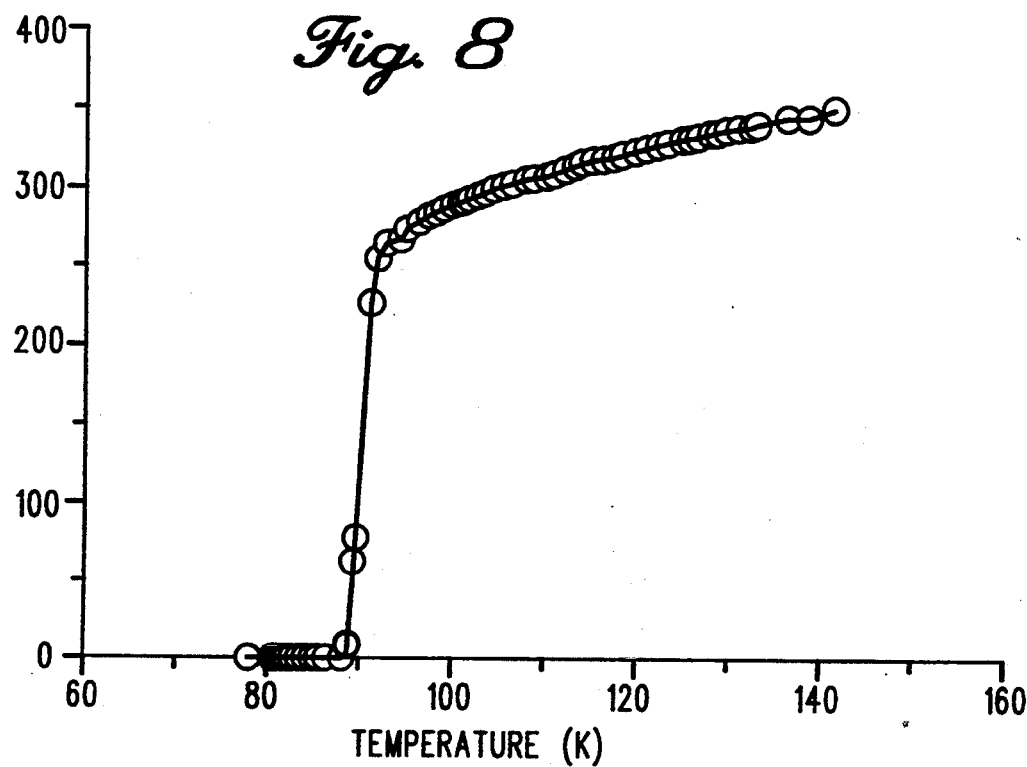
FIG. 8 shows the dependence of electrical resistivity on temperature for typical $YBa_2Cu_3O_x$ produced by the method of the invention.

The electrical properties, specifically J$_c$ and critical temperature (T$_c$), of the sintered wires were examined to determine the effects of heat treatments and grain size on J$_c$ and T$_c$. The onset of critical temperature was $\cong$91K. A typical resistivity plot showing resistivity as a function of temperature is shown in FIG. 8; the transition is sharp, with a typical width of $\sim$3K.

Table IV shows J$_c$ variation as a function of grain size. The J$_c$ data for specimens sintered at 925°–950° C. represent an average for four specimens in each case. The specimens sintered at 910° C. had a low density and only two specimens were evaluated for J$_c$. The standard deviation was generally less than 15%. It was noted that for dense specimens (density $\geq$90% theoretical) sintered at a p(O$_2$) of 0.1 MPa, the J$_c$ changed from 155 A/cm$^2$ for specimens with average grain size of 23 μm to 359 A/cm$^2$ for specimens with average grain size of 6 μm Although the absolute magnitude of J$_c$ may not have much significance, the result indicates a substantial relative decrease occurs in J$_c$ at large grain size. This observation has an important implication for microstructural development of good quality superconductor

TABLE III

Dependence of density, grain size, and strength on heat treatment.

| Sintering temperature and time (°C.)/(h) | p(O$_2$) (MPa) | Density (% theoretical) | Average grain length (μm) | Strength (MPa) |
|---|---|---|---|---|
| 910/10 | 0.100000 | 79 ± 2.0 | $\cong$4.0 | 120 ± 10 |
| 925/10 | 0.100000 | 90 ± 2.5 | 6.0 | 141 ± 09 |
| 935/12 | 0.100000 | 96 ± 0.6 | 16.0 | 91 ± 07 |
| 935/20 | 0.100000 | 96 ± 1.7 | 16.5 | 95 ± 06 |
| 950/20 | 0.100000 | 98 ± 1.3 | 23.0 | 83 ± 05 |
| 910/10 | 0.050000 | 85 ± 2.0 | 3–5 | N A |
| 910/10 | 0.001000 | 91 ± 0.7 | 3–5 | 191 ± 07 |
| 910/10 | 0.0001000 | 94 ± 0.8 | 3–5 | 72 ± 19 |
| 910/10 | 0.000042 | 83 ± 0.4 | 3–5 | 73 ± 38 |

Figure 7:
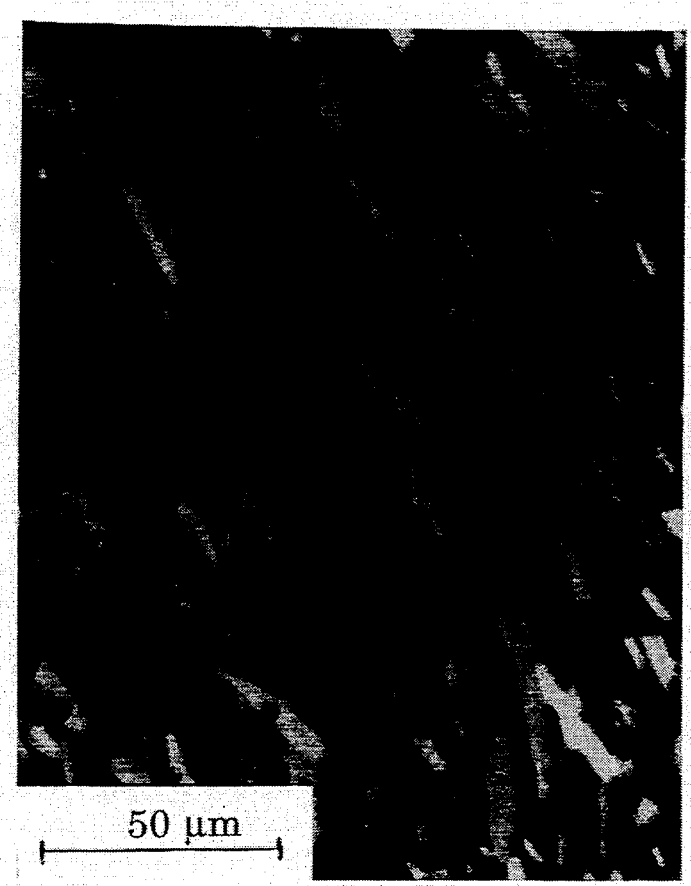
FIG. 7 is an optical micrograph of a $YBa_2Cu_3O_x$ specimen showing intergranular propagation of an indentation crack. The specimen was sintered at 950° C. for 10h in flowing oxygen.

The increase in strength with decrease in grain size (FIG. 6) is associated with a decrease in microcracking with decrease in grain size. Due to the grain anisotropy in YBa$_2$Cu$_3$O$_x$, large internal residual stresses ($\sigma_i$) are developed. FIG. 7 shows a micrograph of YBa$_2$Cu$_3$O$_x$ illustrating the propagation of an indentation crack. The crack propagates primarily along the grain boundaries, probably due to the presence of intergranular stresses due to grain anisotropy. It has been observed that these stresses can be partially or fully relieved by forming microcracks. The crack size (c) will be proportional to grain size, and it can be shown that microcracks will form if the grain sizes are larger than a critical value. Failure will initiate when the applied stress, $\sigma_a$, becomes equal to or greater than the strength, $\sigma_f$, of the material given by Griffith relation $\sigma_f = (2\gamma E/\pi c)^{\frac{1}{2}}$ (where $\gamma$ is the fracture surface energy and E is the elastic modulus). Therefore, in the presence of an internal stress, $\sigma_i$, material.

While not limiting the scope of claim coverage, the reduced J$_c$ at large grain size can derive from the presence of microcracking. Due to grain anisotropy, internal stresses are developed which may result in microcracking in YBa$_2$Cu$_3$O$_x$ if the grains are not properly aligned. The reduced grain size decreases the occurrence of microcracking, while the increase in grain size results in increased microcracking and hence increased number of weak links. This will tend to decrease J$_c$ at increased grain sizes. On the other hand, increase in grain size decreases the number of grain boundaries which will tend to increase J$_c$. In the present study, the observed decrease in J$_c$ at large grain size is believed to be due to the predominant effect of increased weak links arising from increased microcracking.

High density ($\geq$90% theoretical) YBa$_2$Cu$_3$O$_x$ specimens can be fabricated by sintering at relatively low temperature ($\sim$910° C.) in a low p(O$_2$) (0.001 MPa).

These specimens have small-grain microstructures, with an average grain size of 4 μm. The small-grain microstructure results in reduced microcracking, and hence strength as high as 191 MPa is achieved. Reduced microcracking can have important implications for developing microstructures with improved $J_c$.

TABLE IV

Variation of Jc with grain size for specimen sintered at 0.1 MPa

| Sintering temperature and time (°C.)/(h) | p(O2) (MPa) | Density (% theoretical) | Average grain length (μm) | Strength (MPa) |
| --- | --- | --- | --- | --- |
| 910/10 | 0.1 | 79 ± 2.0 | 4.0 | 28 |
| 925/10 | 0.1 | 90 ± 2.5 | 6.0 | 359 |
| 935/20 | 0.1 | 96 ± 1.7 | 16.5 | 351 |
| 950/20 | 0.1 | 98 ± 1.3 | 23.0 | 155 |

The instant invention is concerned with a method of manufacture and product ceramic superconductor. The method of manufacture utilizes second phases of a base superconductor to control grain growth during sintering process to obtain a desired fine grained microstructure which does not diminish the critical current density capacity. The second phases can selectively be removed after controlled sintering to provide the desired density and mechanical properties. By controlled removal of the second phases to form only the ceramic superconductor of highest $J_c$, the high $J_c$ can also be achieved without sacrificing mechanical properties. Such a process results in a combination of properties for high-temperature superconductors, such as $YBa_2Cu_3O_x$, heretofore unachievable although many attempts have been made to obtain such a result.

Other advantages and features of the invention will become apparent from the claims set forth hereinafter with the scope of the claims determined by the embodiments described herein and by those reasonable equivalents as understood by those of ordinary skill in the art.

What is claimed is:

1. A method of manufacturing a ceramic superconductor product, comprising the steps of:
   preparing a starting powder consisting essentially of a ceramic superconductor of the required stoichiometry range of said ceramic superconductor product;
   sintering said starting powder to densify said powder using a partial pressure of p(O2) of about 0.1 Pa to 100 Pa and generating from said starting powder of ceramic superconductor a mixture consisting essentially of said ceramic superconductor and nonsuperconductor second phases during said sintering step; and
   annealing said sintered powder until said mixture of ceramic superconductor and nonsuperconducting second phases converts to said ceramic superconductor product having the required stoichiometry range.

2. The method as defined in claim 1 wherein said step of sintering and generating comprises annealing below the melting point of said ceramic superconductor to generate a fine grained dispersion of said mixture of second phases in the matrix of said first phase.

3. The method as defined in claim 2 wherein said mixture of second phases pins grain boundaries of said ceramic superconductor thereby preventing substantial grain growth of said ceramic superconductor during said sintering step.

4. The method as defined in claim 1 wherein said ceramic superconductor compound consists essentially of 123YBaCu-oxide.

5. The method as defined in claim 1 wherein said ceramic superconductor is selected from the group consisting of 1223 TlBaCaCu-oxide 1212 TlBaCaCu-oxide, 2212 TlBaCaCu-oxide, 2223 TlBaCaCu-oxide, 2234 TlBaCaCu-oxide, 2212 BiSrCaCu-oxide and 2223 BiSrCaCu-oxide.

6. The method as defined in claim 1 wherein the step of maintaining a p(O2) atmosphere during sintering includes maintaining a pressure in the range of about 0.1Pa to about 42 Pa and said starting powder is a 123 YBaCu-oxide.

7. The method as defined in claim 6 wherein said sintered compound has a grain size distribution less than about 0.5 to 15 mm.

8. The method as defined in claim 7 wherein said sintering step includes a sintering temperature less than about 950° C. and more than about 850° C.

9. The method as defined in claim 1 wherein said sintering step includes a sintering temperature below the temperature at which microcracking occurs in said ceramic superconductor.

10. A method of manufacturing a ceramic superconductor product, comprising the steps of:
    preparing a starting powder of a ceramic superconductor having a composition selected from the ceramic superconductor systems TlBaCaCuO, YBaCuO and BiSrCaCuO and having the required stoichiometry range of said ceramic superconductor product;
    sintering said starting powder/under a controlled p(O2) atmosphere of less than about 100Pa and more than 0.1 Pa to densify said powder to at least about 90% theoretical density and generating a second phase consisting essentially of said ceramic superconductor and nonsuperconducting phases decomposed from said ceramic superconductor enabling the controlling of grain growth of said ceramic superconductor; and
    annealing said sintered powder until said second nonsuperconducting phases convert to said ceramic superconductor product having the required stoichiometry range.

11. The method as defined in claim 10 wherein said p(O2) atmosphere is controlled to achieve the desired amount and form of said nonsuperconducting phases.

12. The method as defined in claim 10 wherein said sintering temperature is maintained below the temperature at which microcracking occurs in said ceramic superconductor.

13. The method as defined in claim 10 wherein said starting powder after sintering has a fracture strength of at least about 230 Mpa.

14. The method as defined in claim 10 wherein said ceramic superconductor consists essentially of 123 YBaCu-oxide and said second nonsuperconducting phases comprise $Cu_2O$, $BaCuO_2$ and $Y_2BaCuO_5$.

15. The method as defined in claim 14 wherein said annealing step is performed at about 840° C.

16. The method as defined in claim 15 wherein said annealing step is performed in $O_2$.

17. The method as defined in claim 10 wherein said second phase inhibits grain growth during said sintering step.

* * * * *